United States Patent [19]

Ostriker

[11] Patent Number: 4,668,331
[45] Date of Patent: May 26, 1987

[54] METHOD FOR FORMING SINGLE CRYSTALS OF SILICON BY USE OF A STANDING HYPERSONIC WAVE

[76] Inventor: Jeremiah P. Ostriker, 33 Philip Dr., Princeton, N.J. 08540

[21] Appl. No.: 862,159

[22] Filed: May 12, 1986

Related U.S. Application Data

[63] Continuation of Ser. No. 727,900, Apr. 26, 1985, abandoned, which is a continuation-in-part of Ser. No. 381,424, May 24, 1982, abandoned, which is a continuation-in-part of Ser. No. 291,266, Aug. 10, 1981, abandoned.

[51] Int. Cl.$^4$ .................... C30B 1/08; C30B 13/06
[52] U.S. Cl. .................... 156/603; 156/617 R; 156/DIG. 91; 148/DIG. 98
[58] Field of Search .................... 156/610, 617 R, 622, 156/624, 603, DIG. 73, DIG. 89, DIG. 91; 148/DIG. 98, DIG. 152, DIG. 154

[56] References Cited

U.S. PATENT DOCUMENTS

| | | | |
|---|---|---|---|
| 3,194,640 | 7/1965 | Nesh | 23/293 |
| 3,503,717 | 3/1970 | Wilson et al. | 156/610 |
| 3,867,496 | 2/1975 | Mlavsky et al. | 422/128 |
| 4,371,421 | 2/1983 | Fan et al. | 156/624 |

FOREIGN PATENT DOCUMENTS 217965  1/1985  Fed. Rep. of Germany ... 148/DIG. 152

Primary Examiner—John Doll
Assistant Examiner—Robert M. Kunemund
Attorney, Agent, or Firm—Cohen, Pontani & Lieberman

[57] ABSTRACT

The invention relates to crystallization of solid or molten form crystallizable material deposited by a prior art method on a substrate as a layer of thin or thick film. The invention involves subjecting, during heat treatment causing crystallization or recrystallization, the crystallizable material to a standing hypersonic acoustic wave propagating in either bulk or surface mode at a frequency in the range of 1 to 1000 MHz. The standing wave may have a wavelength that is substantially an integral multiple of a crystal lattice parameter of the crystallizable material as, for example, interatomic spacing, and the integral multiple may range between about 10 and 1,000,000. When applied to silicon, a preferred crystallizable material, the integral multiple ranges in a presently preferred embodiment between about 100 and 2,000. To the extent that the resonance conditions for a standing wave on a given substrate and the integral multiple condition cannot both be simultaneously achieved at all times, the resonance requirement is dominant. It is important that the length between peaks of the standing wave be less than or comparable to the crystal size that would be achieved by the same process in the absence of the acoustic wave.

29 Claims, 6 Drawing Figures

METHOD FOR FORMING SINGLE CRYSTALS OF SILICON BY USE OF A STANDING HYPERSONIC WAVE

This is a continuation of U.S. application Ser. No. 727,900 filed Apr. 26, 1985, now abandoned, which in turn is a continuation-in-part of U.S. application Ser. No. 381,424 filed May 24, 1982, now abandoned, which in turn is a continuation-in-part of U.S. application Ser. No. 291,266 filed Aug. 10, 1981 now abandoned.

TECHNICAL FIELD

The present invention relates to a method and apparatus for inducing single crystal growth of crystallizable material and particularly to a method and apparatus for the production of large single silicon crystals.

BACKGROUND ART

Various methods for the production of large single crystals have been proposed and described, particularly in the silicon art. Interest in this development has been stimulated to a large degree by expanded interest in solar cells, the most common of which are made from silicon. While the raw material is inexpensive, efficiency of energy conversion depends on crystal size in a polycrystalline silicon film, and it has been difficult and expensive to find methods for cheaply and efficiently producing large areas of high purity single crystal material.

Presently, commercial processes for the production of high purity silicon include zinc reduction of silicon tetrachloride, and thermal decomposition of trichlorosilane at slow rate followed by Czochralski crystal growth. Various other processes like zone refining, dendrite web processes or edge-defined, film-fed growth are further examples of other methods which are being or have been used to produce single-crystal silicon in the semiconductor field. At the present time, the most promising of these methods appears to be the use of chemical vapor deposition methods using metallurgic grade silicon or a silicon dipping process, whereby the silicon is deposited upon a wettable substrate. Partial grain enhancement of the films may then be achieved as by laser or moving strip heater recrystallization. It is also known that crystal growth can be enhanced if an artificial pattern is etched on the substrate before thermal annealing, see "Silicon Grapheopitaxy Using a Strip Heater Oven" by M. W. Geis, et al, Appl. Phys. Lett 37(5) (1980) pp. 454-456. For example, the pattern may be a multiplicity of closely spaced parallel lines. Subsequent heat treatment by the use of either a laser or an oven may be used to effect controlled recrystallization in order to promote larger crystal size. These methods realize thin film polycrystalline silicon solar cells exhibiting efficiencies of between 9.5 to 10.1 percent.

The use of ultra sound to induce physical movement of solid iron oxide crystals to orient tnem in parallel relation in order to materially increase the sensitivity of magnetic tapes is disclosed in U.S. Pat. No. 3,194,640. Directional solidification of fine grain semiconductor bodies of chalcogenides under the influence of controlled sonic vibration is disclosed in U.S. Pat. No. 3,867,496. The purpose of the sonic energy is not entirely clear from this patent, although it is clear that there is no suggestion of forming a standing wave.

DISCLOSURE OF THE INVENTION

It has now been found that single crystals of a crystallizable material of a given lattice parameter, i.e. atomic spacing, can be oriented during crystallization or recrystallization by subjecting that material to a standing hypersonic acoustic wave propagating in either bulk or surface mode during crystallization and/or recrystallization. At the same time, the size of crystals will grow larger, sometimes by a factor of the order of 100. The wavelength of the wave may be adjusted according to the lattice parameter of the material to be crystallized or recrystallized so that the nodes of the standing hypersonic wave are spaced apart by a distance which is equal to an integral multiple of the lattice parameter of the crystallizable material. Another control of wavelength believed to be desirable is that the wavelength of the starting wave be comparable to or smaller than tne crystal diameter which would be achieved in the absence of the hypersonic standing wave. While subjecting the material to such orienting wave, the temperature and/or temperature gradient is controlled in an appropriate temperature range, preferably until crystallization and/or recrystallization ceases for all practical purposes. The wave is maintained, during the recrystallization process, as a stationary standing wave by suitable control of the driving frequency.

The present invention also includes an apparatus for carrying out the above process in a continuous manner.

BEST MODE FOR CARRYING OUT THE INVENTION

Figure 1:
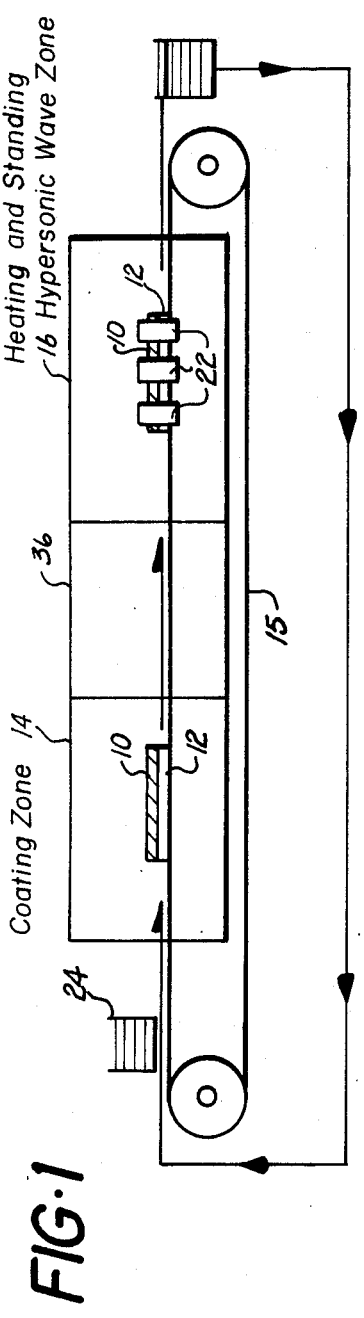
FIG. 1 is a schematic diagram illustrating both tne apparatus for the continuous production of large crystals of silicon, and the method thereof.

The present invention relates to the growth of single crystals of crystallizable material. While any crystallizable material may be employed in connection with the present invention, it is preferred that the crystalizable material be monatomic and more preferably silicon and germanium, although polyatomic crystals such as gallium arsenide may be eminently suited to production by my method. Despite my present emphasis on silicon, germanium and gallium arsenide, it will be understood that my method and apparatus are not intended for use only on such crystallizable materials and may be useful with other materials such, for example, as tin, iron, titanium and numerous crystallizable organic materials.

The invention also relates to the growth of single crystals of silicon in connection especially with prior art methods wherein the silicon is deposited as a layer on a supporting suitable substrate. By use of the word "layer", it is intended to include thin films, thick films, as well as coatings or layers of relatively substantial thickness. Accordingly, the words film and layer will be used interchangeably hereinafter.

As already indicated the methods with which the current invention will find its maximum utilization are methods in which the silicon layer is supported by an underlying substrate. The substrate must be made of a material which has a melting point greater than the maximum processing temperature and which is nonreactive with the silicon. For silicon, the substrate may be made of high temperature glass, some steels, molybdenum, graphite, certain ceramics such as alumina, quartz and the like. For silicon, it is preferred that the substrate have a wettable surface such as graphite in order to ensure good adhesion between the silicon layer and the underlying substrate. Another satisfactory substrate may have a crystalline structure similar to that of the crystallizable material, such as silicon on silicon, gallium arsenide on germanium, etc.

If graphite is the substrate material, then quite obviously no problem will be encountered. For other substrate materials, it would be preferred to coat such substrate materials with a layer of graphite. If the substrate is non-metallic, such as alumina, the graphite layer will also act as an electrical contact or terminal to the lower surface of the silicon film in the photovoltaic cell ultimately formed therefrom.

As previously indicated the present invention may be used with any method of growing single crystals of silicon in which the silicon is in the form of a layer on a substrate. Thus, any prior art method for growing such crystals may be employed and any future developed method for growing such crystals may well be combined with the present invention to further enhance crystal growth. Accordingly, the mode of depositing a layer of silicon on a substrate is not, per se, part of the present invention, nor is the thermal technique for converting such coated layer to a large single crystal or to a polycrystal of large crystal size. As will become more apparent as this specification proceeds, the central point of this invention is to subject the silicon layer and the underlying substrate to a hypersonic standing wave in the preferred frequency range of 1 to 1000 $MH_z$ during the growth of crystals, by whatever method, so as to orient the atomic structure of the silicon layer during crystal growth in such a way as to promote growth or single crystals parallel to the standing wave nodes. As will be more fully understood from the following description, the preferred or desired wavelength of the hypersonic wave may be a function of the lattice parameter of the crystallizable material as, for example, an integral multiple thereof, and it is desirable that the wavelength of the standing wave not exceed the diameter of crystals which would grow in the absence of the standing wave.

DEPOSITION OF SILICON ON SUBSTRATE

As previously noted, any of the prior processing techniques may be employed in connection with the present invention. At the present state of knowledge of the invention, it would appear that the manner of depositing silicon on the substrate is a matter of engineering choice. It would also be a matter of engineering choice whether the film is deposited in the form of an amorphous film or as polycrystalline or microcrystalline film. Current review of the literature would indicate some preference for working with amorphous films although this is not altogether clear at this time. As known in the prior art, amorphous silicon films can be prepared on a graphite substrate by deposition from silane in an r.f. discharge. The plasma/glow discharge produced amorphous silicon films can be deposited on a suitable substrate using a commercially available CVD reactor at relatively low temperatures, preferably below 450° C. Such films provide an excellent starting material for hypersonic standing wave crystallization as disclosed herein.

The silicon layer may also be deposited as fine grained polycrystalline or microcrystalline film by the prior art technique known as high pressure plasma (hpp) deposition. In this well known process, silicon deposition is accomplished by introducing hydrogen and trichlorosilane into the plasma beam. In both of these vapor deposition methods, the silicon is doped, preferably during deposition. The film is preferably doped during deposition by introducing a suitable dopant into the plasma beam. The thermal reduction of trichlorosilane with hydrogen is conducted at temperatures of about 1100° C. to about 1150° C. Polycrystalline silicon layers may also be produced by dipping a graphite coated ceramic substrate into molten silicon, or by plasma/glow discharge at temperatures above 450° C., preferably above 600° C.

Still another way of depositing the silicon onto the surface of tne substrate is by the controlled deposition of molten silicon onto a moving substrate. By controlling the opening through which the silicon flows and by controlling the speed at which the substrate passes under said opening, the thickness of the silicon layer to be deposited on tne substrate can be controlled within relatively fine limits. Apparatus for forming a layer from molten silicon is shown schematically in FIG. 4.

Figure 4:
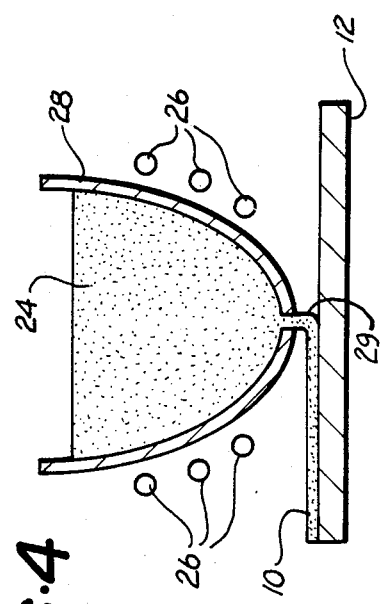
FIG. 4 is a cross-sectional view of an apparatus for coating a layer of molten silicon on a substrate.

Referring to FIG. 4, the silicon may be placed in a crucible 28 which is heated by any suitable heating means such as, for example, gas burners or, as shown, electric heater coils 26. Clearly, the heating means must be effective for heating the silicon within the crucible 28 to a temperature above the melting point of silicon, variously reported in the literature as being somewhere between 1410° C. and 1423° C. At the time of the melting of the silicon in the crucible 28 or after it has become molten, a dopant is preferably added. Provided in the bottom of the crucible 28 is a metering slit 29 which is proportioned to permit silicon at a predetermined temperature above the melting point to flow therethrough at a rate that will yield on a substrate moving at a predetermined speed a coating or layer of predetermined thickness.

Another mode of practicing the present invention would be to obtain as a commercial product a silicon coated substrate. Such products are obtainable in the marketplace. The method of coating, per se, would form no part of the present invention, as previously indicated. However, and as will be discussed in greater detail hereinafter, there is some indication in the literature that the presence of oxygen and consequently silicon dioxide (silica), or both, within the coated substrate impedes the formation or growth of single crystals of silicon. If this is accurate, the use of commercially purchased coated substrates may be disadvantageous.

Irrespective of the manner of obtaining the coated substrate, it is currently preferred that the tnickness of the silicon layer 10 on the substrate 12 range from a minimum of about 50 microns to a maximum of about 1000 microns. Preferably, the layer has a thickness of between about 100 and about 500 microns and more preferably between about 500 and about 600 microns.

ATMOSPHERE DURING PROCESSING

During the formation of the silicon film on the substrate, as well as during the thermal treatment when, in accordance with the invention, the film is subjected to standing wave hypersonic energy, there is indication in the prior art literature that the atmosphere should be controlled. Much of the current literature relating to this aspect of single silicon crystal growth indicates that it is preferable that the silicon be maintained in a non-oxidizing atmosphere during the processing, either an inert or a reducing atmosphere. A suitable inert atmosphere for silicon at elevated temperatures may be, for example, helium, argon or nitrogen. A reducing atmosphere, as for example, hydrogen, may also be employed although this introduces the potential hazard of explosion or fire which is not present when an inert atmosphere is used. However, reducing atmospheres should not necessarily be disregarded for this reason since there is indication in the prior art that hydrogen promotes single crystal growth by reducing oxide impurities present in the silicon.

Some prior art literature indicates that oxygen actually promotes orderly growth of silicon by producing a silica cap over the underlying metallic silicon. Such a silica cap can be preproduced or it can be grown as a result of the coating or heat treating step by working in an oxidizing atmosphere. The mechanism through which a silica cap operates to promote orderly crystalline growth of silicon is not understood by the present inventor nor by those observing this phenomena in the prior art literature. Of course, if an oxidizing atmosphere is employed and a silica cap grows over the silicon, that cap will have to be removed as by chemical etching prior to the ultimate utilization of the silicon crystal.

SINGLE CRYSTAL GROWTH

Single crystal growth will occur in a heated environment. If the silicon layer is solid, and is to be treated in a solid state in the recrystallization temperature range, the temperature may vary between 500° C. and the melting point of silicon. The amount of time necessary to promote crystal growth in the solid state is dependent upon the temperature to which the silicon layer is subjected Thus, according to a publication appearing in Appl. Phys. Lett. 35(3), pp. 280-282, of Aug. 1, 1979, at 500° C., the time for holding the silicon at temperature to promote such crystal growth would be in excess of 1000 minutes, whereas at 600° C. the holding time would be only about 10 minutes or so. The holding time would be reduced to about one minute at about 700° C.

In contrast, if crystal growth is to be effected from molten silicon, then the temperature at the beginning of the crystal growing process will be above the melting point of silicon. The rate of cooking may have significant impact on the nature of the crystal growth and crystal orientation thus may be effected by the use of a thermal gradient, as is already known in the art.

Figure 2:
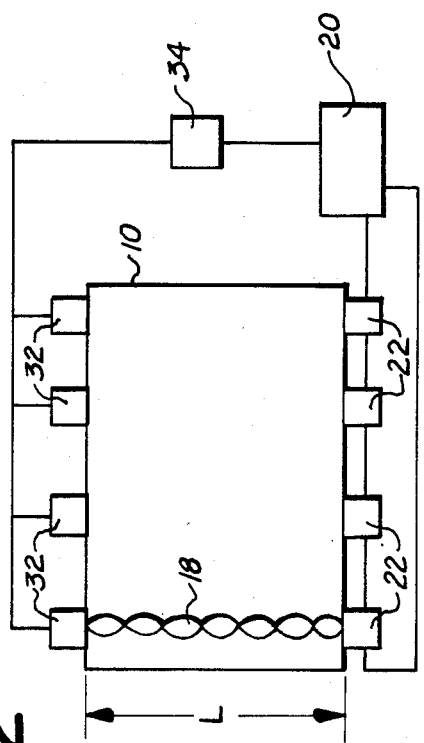
FIG. 2 is a schematic top view of a part of the apparatus of the present invention.
Figure 3:
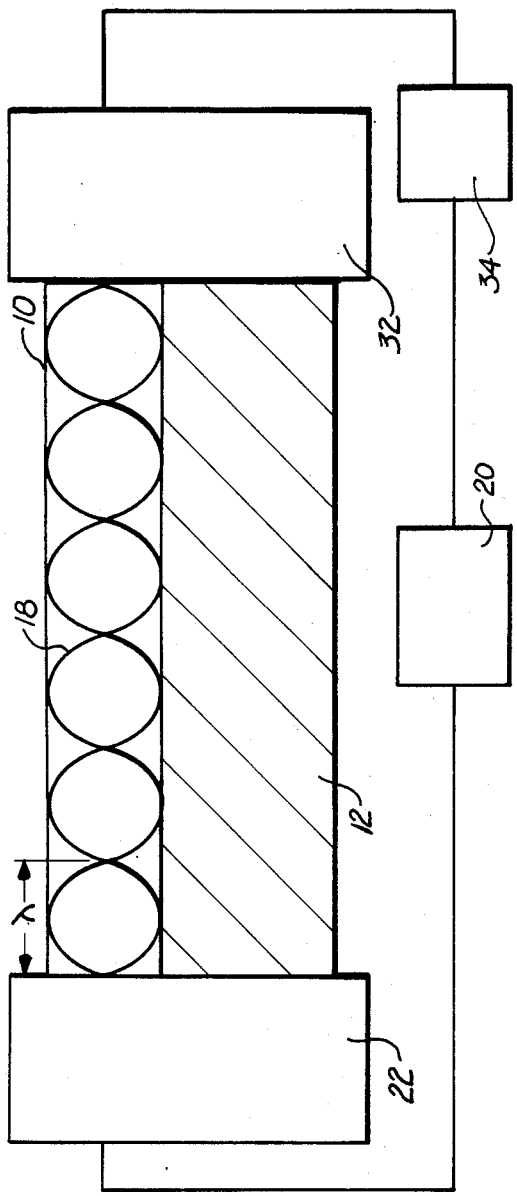
FIG. 3 is a schematic view, partially in cross-section, illustrating both the apparatus and method of the invention.
Figures 5, 6:
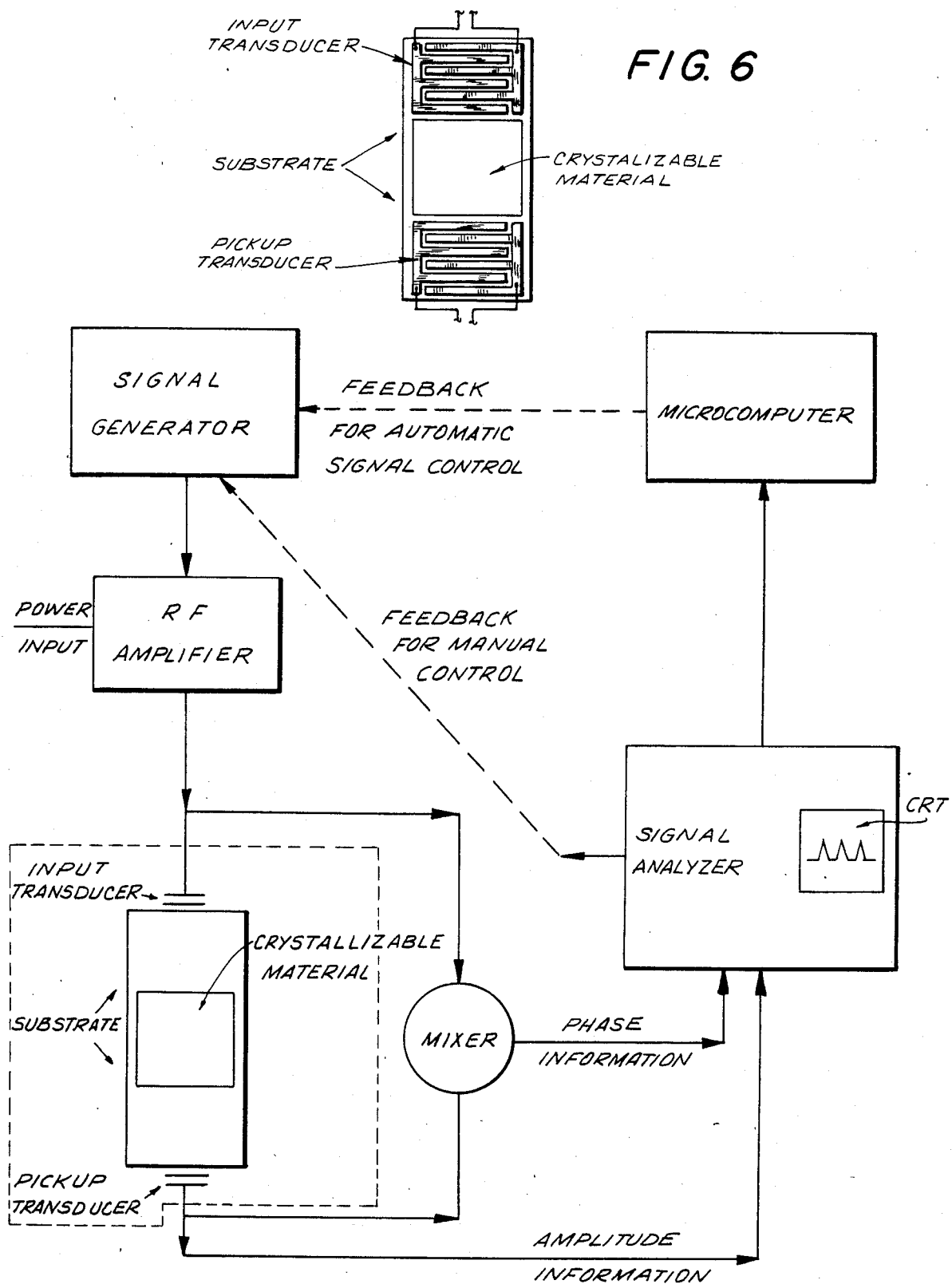
FIG. 5 is a schematic block diagram of the apparatus in accordance with the invention for controlling the wave frequency to maintain a standing wave condition.
FIG. 6 shows a substrate carrying crystallizable material and input and pickup transducers mounted on the substrate surface for propagating a surface acoustic wave across the surface material.

Irrespective of whether or not the single crystal growth is to be promoted from a solid silicon layer or from a molten layer and whether or not, if solid, the crystallizable material is amorphous or poly or multi-crystalline, in accordance with the present invention during the period of crystal growth the crystallizible material is subjected to a standing hypersonic wave which is shown scnematically in FIGS. 2 and 3 by the sinusoidal waves marked 18. By virtue of the standing wave, the crystal lattice will unoergo an ordering and transformation to a single crystal layer. It is presently preferred that the wavelength $\lambda$ of the hypersonic wave be predetermined so that there is an integral number of stationary waves across the width W of the substrate 12 upon which the silicon layer 10 is disposed, in order to maintain the standing wave condition. It may also be useful for the wavelength to be substantially equal to an integral multiple "n" of the silicon lattice parameter, i.e. the width or interatomic spacing of a silicon cubic crystal lattice. If the wavelength is an integral multiple of the lattice parameter, eg. n·$\lambda$, then "n" is preferably within the range from about 100 to about 100,000. If silicon is the crystallizable material, "n" is preferably in the range from about 100 to about 1,000,000, with a more preferred range of about 200 to about 2,000. The number of waves "N" standing across the width "W" of the substrate is not critical, other than tnat "N", which equals W/$\lambda$, should also preferably be large enough so that $\lambda$ is comparable to or smaller than the average crystal diameter which would have been achieved in the absence of the standing wave. The number "N" is determined by practical considerations such, for example, as the energy output required to sustain the standing wave. While the silicon may be subjected to the standing hypersonic wave for less than the full period of time during which crystal growth occurs, it is presently preferred that the silicon be subjected to the standing hypersonic wave for the full period of time. If operating within the preferred parameters, it is, of course, desirable to continuously monitor the wavelength of the standing hypersonic wave and to control that wavelength in order to meet the requirements above set forth during the entire time the silicon is subjected to the hypersonic energy. A schematic block diagram of an experimental apparatus used for this purpose is shown in FIG. 5. Other apparatuses may suggest themselves to persons of ordinary skill in tne art.

In the manufacturing of electronic devices it is sometimes advantageous to produce several layers of a crystalline semiconductor material such as silicon, germanium or gallium arsenide separated by layers of insulators and electrical connections. Such layering can produce significant increases in the speed at which the electronic devices operate. However, prior art layering techniques have not produced entirely satisfactory results because the overlying layers of crystal so formed are often imperfect. Notably improved multilayered materials are attainable in accordance with the present invention in the following manner. A single crystal substrate, in this example taken by way of illustration to be silicon, is prepared. In a central surface region of the substrate a thin insulating layer of silicon dioxide ($SiO_2$) is introduced. Then a layer of amorphous silicon is added overlaying this insulating layer. Heating and recrystallization using known techniques and by the present inventive method utilizing a standing hypersonic wave is performed as described herein. Electronic logic devices are then formed on this layer by conventional means (doping, etching, deposition of contacts, etc.). Next, a thin insulation layer is added atop the first deposited silicon layer and the entire process—of heating and recrystallization using known techniques in combination with the inventive subjection to a hypersonic standing wave to reorient and promote crystal growth of the second deposited silicon layer—is repeated. Additional alternating layers of thin insulation material and of amorphous silicon may continue to be added in this manner to achieve the final number of layers desired. In this was very compact, high speed electronic devices can be produced. It should also be recognized and understood that the specification of silicon as the layered crystallizable material, and as the substrate material, as well as the mention of silicon dioxide as the insulating layer material, is intended to be solely by way of example and that other materials can be utilized as alternatives.

APPARATUS FOR CARRYING OUT METHOD

It is not, of course, at all times and in all instances possible to simultaneously satisfy both the aforementioned integral conditions—i.e. that the hypersonic wave wavelength $\lambda$ both provide an integral number of stationary waves across the width of the substrate and equal an integral multiple of the width or interatomic spacing of the crystallizable material lattice. Given the dimensions involved at the atomic level, the substrate will be an imperfectly integral multiple of the lattice parameter. The relations $W/\lambda = $ "N" and $\lambda/a = $ "n" (where "a" is the interatomic spacing) imply a generally unachievable requirement, namely that $W/a = N \cdot n$. The standing wave condition $W/\lambda = N$ is the more important of the two conditions, as that will maintain the wave fronts parallel to one another and minimize the energy input requirements since reflection at the opposite sides of the resonant system can thus be maintained. The other condition, $\lambda/a = n$, will only be achieved transiently during temperature cycling. To the extent that crystal growth rates can be monitored continuously, it should be possible to maximize the duration of intervals during which this desirable second resonance condition is satisfied.

If the energy is caused to resonate in the body of the substrate—that is if bulk acoustic waves are employed—then opposing edges of the substrate should be accurately parallel and polished to achieve the large value of the resonant parameter Q. If on the other hand resonance is induced only in the surface layer, i.e. surface acoustic waves are employed, the crystallizable material deposition should preferably occur in the region between opposing sets of fingers on the surface resonator, as for example illustrated in FIG. 6.

FIGS. 2 and 3 illustrate in schematic fashion an apparatus for subjecting silicon to a standing hypersonic bulk standing wave during the growth of single crystals. With reference to FIGS. 2 and 3, that apparatus includes a frequency signal generator 20 connected to one or more electro-mechanical transducers 22, here shown as four in number. The transducers may be disposed within an oven or furnace 16 suitable for maintaining the coated substrate 10, 12 at temperature, as above described, so that the vibrating face of the transducers would be in close confronting, preferably engaging relationship with the side of the substrate 12. If the temperature within the oven or furnace 16 is so high as to be likely to have a deleterious effect upon the transducers 22, then the transducers 22 may, in the alternative, be disposed outside of the furnace 16 and have their vibrating faces connected to high temperature members, such as carbon or quartz rods or the like, which extend through the wall of the furnace 16 to a position where they engage and hence vibrate the coated substrate 10, 12 disposed within the oven.

As previously noted, it is preferred that the hypersonic signal generator 20 be continuously controlled so tnat the wavelength of the hypersonic wave generated by transducers 22 is maintained at a definite length to assure proper reflection at the side of the substrate to hold the wave standing. In this regard it will be recognized that for a fixed frequency, the wavelength will vary as the medium through which the wave travels varies in composition, density or temperature. Since the medium can not be controlled to absolute uniformity, it is necessary to vary the output frequency of the signal generator 20 if it is desired to maintain a wavelength which is a fixed integral multiple of the lattice parameter, as is preferred. The mechanism for achieving this kind of control is well within the ability of persons skilled in the art of frequency and wavelength control or regulation, using a simple feedback principle as shown in FIGS. 2 and 3 and, in a more sophisticated arrangement, in FIG. 5. Many other devices and systems are well known in the art for achieving this goal.

FIG. 2 illustrates, by way of example, a schematic of such a system which includes one or more, here shown as four, electro-mechanical transducers 32 which are adapted to generate an electric signal as a function of the amplitude of the perturbation at the face of the transducers on the side of the substrate 12 opposite transducers 22. If the wave is truly a stanoing wave then, in the system or FIGS. 2 and 3, the amplitude of the hypersonic waves at transducers 32 will be zero and the output of transducers 32 will be zero or will, at least, approach zero. However, should the medium of substrate 12 be changed as in density, composition or temperature, or should the output frequency of generator 20 drift, then there would not be a null at the face of transducers 32 and those transducers will generate a signal. The signal is preferably amplified by an amplifier 34 and is fed back to signal generator 20 to alter, by increasing or decreasing, its output frequency to bring the energy sensed at the face of the transducers 32 back to zero. Thus, the output frequency of generator 20 is controlled to control the wavelength of the hypersonic wave passing through the substrate from generating transducers 22 to detecting transducers 32. Such an arrangement is required to maintain the standing wave condition. This, of course, assumes a close match in the coefficients of thermal expansion of silicon and the substrate material, which is thought to be desirable.

A somewhat more sophisticated arrangement for automatically maintaining the standing wave condition of the generated hypersonic wave is shown in FIG. 5. In this system, both amplitude and relative phase information at the pickup transducer(s) is monitored by a signal analyzer for either manual or—through a microcomputer—automatic control of the hypersonic wave wavelength output from the signal generator. Although the arrangement of FIG. 5 contemplates the use of bulk acoustic waves propagated through the body of the crystallizable material bearing substrate in accordance with the invention, the system is equally applicable where surface acoustic waves induced only in the surface layers are employed. In utilizing surface, rather than bulk, acoustic waves, that portion of FIG. 5 shown in dotted lines may be replaced by that illustrated in FIG. 6. Thus, where in the FIG. 5 arrangement the input and output transducers are disposed in close confronting, preferably engaging relationship with opposite edges of the substrate, in using surface acoustic waves the transducers may be located directly on the substrate on opposite sides of the crystallizable material deposition. Such placement of the transducers will induce resonance only in the surface layer and may be accomplished in any desired manner as, for example, by depositing and etching metallic conductive fingers or areas of appropriate size and configuration directly on the substrate.

Since piezoelectric effects occur only in crystals, when employing surface acoustic waves the substrate must be formed of a single crystal of appropriate kind. In the FIG. 6 arrangement, the piezoelectric substrate may by way of example comprise single crystal quartz, although those skilled in the art will recognize that other substrate materials, such as of synthetic sapphire, may be used in place of quartz.

CONTINUOUS PROCESSING APPARATUS

Referring now to FIG. 1, there is illustrated an apparatus by which the above prior art techniques in any of the forms so described may be practiced on a continuous basis in combination with the present invention. Thus witn reference to FIG. 1, a stack of substrates may be stored in substrate dispensing mechanism 24 having an open bottom in engagement with a high temperature continuously or intermittently movable conveyor belt 15. Belt 15 extends around pulleys or rollers at both ends thereof for removing substrates 12 one at a time from dispenser 24 and for moving them successively through the apparatus for coating silicon on the substrate and for thereafter growing single silicon crystals in accordance with the invention. Specifically, as a substrate 12 is removed from the dispensing device 24 it is moved into a processing zone 14 in which silicon may be coated onto the upper surface of the substrate 12 as it passes therethrough. The mode of dispensing a layer of silicon onto the substrate 12 may be in accordance with any of the previously disclosed prior art methods or others not heretofore disclosed but which are currently known in the prior art or which may be discovered hereinafter, the application of silicon to the substrate forming no part of the invention per se. Of course, the zone 14 is heated, preferably above 450° C., and possibly as high as a temperature above the melting point of silicon, depending upon the selected mode of applying the silicon to the substrate 12 and the selected mode or enhancing crystal growth in furnace 16, as will subsequently be discussed.

After the silicon has been applied to the surface of the substrate 12, it is advanced from the application zone 14 to the furnace zone 16 in which it is subjected to a temperature or temperatures as previously described, and to a hypersonic standing wave having a wavelength of between 200 and 1,000,000 times the lattice parameter. To avoid the loss of heat between zones 14 and 16, a suitable intermediate zone 36 may be included in the apparatus which zone 36 may be heated and may serve to either heat further the silicon 10 and substrate 12 or to cool it down, depending upon the techniques used at zones 14 and 16. In the alternative, the zones 14 and 16 may be contiguous to one another thereby obviating any need for tne intermediate zone 36. In furnace 16, the silicon, be it solid and either polycrystalline or amorphous, or be it molten, is subjected to the thermal and hypersonic energy steps heretofore described whereby to grow single crystals. After the single crystals have been grown in the furnace 16, the continuously or intermittently moving belt 15 will advance the coated substrate 12 out of the furnace 16 and to a receiving section 38, whereby to conclude the process.

Additional various well known methods for measuring, for example, electrical properties or an X-ray diffraction pattern, may be used to continuously monitor crystal growth, thereby allowing temperature or rate of progress of the coated substrate to be continuously adjusted to optimum values.

While I have herein shown and described the preferred embodiments of the present invention and have suggested certain modifications thereto, it will be apparent that further changes and modifications may be made without departing from the spirit and scope of the invention. Accordingly, the above description should be construed as illustrative and not in the limiting sense, the scope of the invention being defined by the following claims.

I claim:

1. In a method of growing a single crystal of crystallizable material having a lattice parameter, wherein a layer of said crystallizable material is deposited on a substrate and is heat treated to cause crystal growth, the improvement comprising the step of subjecting said crystallizable material during said heat treatment to a standing hypersonic wave.

2. In a method of growing a single crystal according to claim 1, wherein said crystallizable material is monatomic.

3. In a method of growing a single crystal according to claim 1, wherein said crystallizable material is metailic.

4. In a method of growing a single crystal according to claim 1, the wavelength of said standing wave being an integral multiple of said lattice parameter.

5. In a method of growing a single crystal according to claim 4, wherein said integral multiple does not exceed about 1,000,000.

6. In a method of growing a single crystal according to claim 4, wherein said crystallizable material is silicon, and said integral multiple ranges between about 200 and about 1,000,000.

7. In a method of growing a single crystal according to claim 4, wherein said crystallizable material is silicon, and said integral multiple ranges between about 200 and about 2,000.

8. In a method of growing a single crystal according to claim 6, wherein said layer of silicon has a thickness between about 100 microns and about 1,000 microns.

9. In a method, of growing a single crystal according to claim 6, wherein said layer of silicon has a thickness between about 300 microns and about 800 microns.

10. In a method of growing a single crystal accoroing to claim 7, wherein said layer of silicon has a thickness between about 500 microns and about 600 microns.

11. In a method of growing a single crystal according to claim 6, wherein the surface layer of that portion of the substrate on which the silicon layer is deposited is graphite.

12. In a method of growing a single crystal according to claim 11, wherein the silicon layer is deposited from silane in an r.f. discharge.

13. In a method of growing a single crystal according to claim 12, wherein the silicon deposition is performed at a temperature below about 450° C.

14. In a method of growing a single crystal according to claim 13, wherein said integral multiple ranges between about 200 and about 2,000.

15. In a method of growing a single crystal according to claim 14, wherein said layer of silicon has a thickness between about 100 microns and about 1,000 microns.

16. In a method of growing a single crystal according to claim 14, wherein said layer of silicon has a thickness between about 500 microns and about 600 microns.

17. In a method of growing a single crystal according to claim 6, wherein said heat treatment comprirses heating said silicon to a temperature above about 500° C.

18. In a method of growing a single crystal according to claim 17, wherein said heat treatment is performed at a temperature below the melting point of silicon.

19. In a method of growing a single crystal according to claim 6, wherein said heat treatment comprises the steps of melting said silicon and then gradually cooling said silicon to solidify it.

20. In a method of growing a single crystal according to claim 10, wherein said heat treatment is performed at a temperature above 500° C. and below the melting point of silicon.

21. In a method of growing a single crystal according to claim 10, wherein said heat treatment comprises the steps of melting said silicon and then gradually cooling said silicon to solidify it.

22. In a method of growing a single crystal according to claim 6, wherein said silicon is subjected to said standing wave during a portion only of said heat treatment.

23. In a method, of growing a single crystal according to claim 6, wherein said silicon is subjected to said standing wave throughout substantially the entire heat treatment.

24. In a method of growing a single crystal according to claim 20, wherein said silicon is subjected to said standing wave during a portion only of said heat treatment.

25. In a method, of growing a single crystal according to claim 20, wherein said silicon is subjected to said standing wave throughout substantially the entire heat treatment.

26. In a method, of growing a single crystal according to claim 21, wherein said silicon is subjected to said standing wave during a portion only of said heat treatment.

27. In a method of growing a single crystal according to claim 21, wherein said silicon is subjected to said standing wave throughout substantially the entire heat treatment.

28. In a method of preparing a multilayer material formed of alternating layers of single crystal crystallizable material having a lattice parameter separated by an insulating material layer, wherein a first said layer of crystlalizable material is deposited on a substrate and is heat treated to cause crystal growth, and wherein at least one additional layer of crystallizable material is deposited over said first layer of insulating material with a layer of insulating material therebetween and is heat treated to cause crystal growth, the improvement comprising the step of subjecting at least one said layer of crystallizable material during said heat treatment thereof to a standing hypersonic wave.

29. In a method of preparing a multilayer material according to claim 28, wherein the improvement comprises the step of subjecting each said layer of crystallizable material during said heat treatment thereof to a standing hypersonic wave.

* * * * *